United States Patent
Krassnitzer et al.

(10) Patent No.: US 12,325,906 B2
(45) Date of Patent: Jun. 10, 2025

(54) METHOD FOR FORMING Al-RICH AlTiN COATING LAYERS BY PVD FROM METALLIC TARGETS

(71) Applicant: Oerlikon Surface Solutions AG, Pfäffikon, Pfäffikon (CH)

(72) Inventors: Siegfried Krassnitzer, Feldkirch (AT); Marijana Mionic Ebersold, Dübendorf (CH); Siva Phani Kumar Yalamanchili, Sargans (CH)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 5 days.

(21) Appl. No.: 18/246,877

(22) PCT Filed: Sep. 29, 2021

(86) PCT No.: PCT/EP2021/076867
§ 371 (c)(1),
(2) Date: Mar. 28, 2023

(87) PCT Pub. No.: WO2022/069589
PCT Pub. Date: Apr. 7, 2022

(65) Prior Publication Data
US 2023/0399733 A1    Dec. 14, 2023

(30) Foreign Application Priority Data
Sep. 29, 2020   (DE) .................... 10 2020 005 954.6

(51) Int. Cl.
*C23C 14/06* (2006.01)
*C23C 14/32* (2006.01)
*C23C 14/34* (2006.01)

(52) U.S. Cl.
CPC ........ *C23C 14/0641* (2013.01); *C23C 14/325* (2013.01); *C23C 14/3407* (2013.01)

(58) Field of Classification Search
CPC .............. C23C 14/0641; C23C 14/325; C23C 14/3407
See application file for complete search history.

(56) References Cited

U.S. PATENT DOCUMENTS

| | | | |
|---|---|---|---|
| 6,824,601 B2 | 11/2004 | Yamamoto et al. | |
| 8,409,702 B2* | 4/2013 | Ni | C23C 30/005 51/307 |
| 9,896,767 B2* | 2/2018 | Kumar | C23C 14/0021 |
| 10,710,169 B2 | 7/2020 | Tanaka | |
| 2007/0154739 A1* | 7/2007 | Martensson | C23C 14/325 428/698 |
| 2010/0151260 A1* | 6/2010 | Westphal | C23C 30/005 428/689 |
| 2011/0170972 A1* | 7/2011 | Zielonka | B23B 51/04 408/206 |
| 2011/0293384 A1* | 12/2011 | Johansson | C23C 14/0641 409/131 |
| 2012/0201615 A1* | 8/2012 | Ni | C23C 14/0641 407/30 |
| 2013/0171374 A1* | 7/2013 | Sjolen | C23C 14/325 427/580 |
| 2014/0287209 A1* | 9/2014 | Kurapov | C23C 28/04 428/218 |
| 2017/0145556 A1* | 5/2017 | Andersson | C04B 41/89 |
| 2019/0061013 A1 | 2/2019 | Hirano et al. | |
| 2019/0076933 A1 | 3/2019 | Nishizawa | |
| 2024/0018642 A1* | 1/2024 | Yalamanchili | C23C 14/0641 |

FOREIGN PATENT DOCUMENTS

| | | |
|---|---|---|
| JP | H07197235 A | 8/1995 |
| WO | WO 2011/131460 A2 * | 10/2011 |
| WO | 2019048507 A1 | 3/2019 |

OTHER PUBLICATIONS

Birol, Yucel, et al., "High-Temperature Sliding Wear Testing of Cathodic Arc Physical Vapor Deposition AlTiN- and AlTiON-Coated Hot Work Tool Steels". Metallurgical and Materials Transactions A, Nov. 2011, vol. 42A, 3316-3322.*

Fox-Rabinovich, G.S., et al., "Design and performance of AlTiN and TiAlCrN PVD coatings for machining of hard to cut materials". Surface and Coatings Technology, vol. 204, Issue 4, Nov. 15, 2009, pp. 489-496.*

Kohlscheen, Joern, et al., "Effect of Hexagonal Phase Content on Wear Behaviour of AlTiN Arc PVD Coatings". Coatings, Aug. 2018, 72, pp. 1-9.*

Kamena, Anna, et al., "Structure and Electrochemical Behavior of AlN, AlTiN, and AlTiSiN Physical Vapor Deposition Coatings in 3% NaCl Solution". Journal of Materials Engineering and Performance, vol. 31(12) Dec. 2022, 10402-10411.*

Hsu, Cheng-Hsun, et al., "Corrosion resistance of TiN/TiAlN-coated ADI by cathodic arc deposition". Materials Science and Engineering A 421(2006):182-190.*

Chim, Y.C., et al., "Oxidation resistance of TiN, CrN, TiAlN and CrAlN coatings deposited by lateral rotating cathode arc". Thin Solid Films 517 (2009) 4845-4849.*

(Continued)

*Primary Examiner* — Bret P Chen
(74) *Attorney, Agent, or Firm* — Chrisman Gallo Tochtrop LLC (57) ABSTRACT

A method for producing coated substrates involving deposition of at least one coating layer on a surface of the substrate. The coating layer is synthesized in the interior of a vacuum coating chamber by using reactive PVD cathodic evaporation techniques. Nitrogen gas is introduced in the vacuum coating chamber to be used as reactive gas, and at least one arc evaporation source comprising a target material operated as cathode for evaporating the target material is used. The method involves a reactive deposition of aluminium titanium nitride as a result of a reaction between aluminium and titan from the target material with nitrogen from the nitrogen gas comprised in the coating chamber.

13 Claims, 5 Drawing Sheets

(56) References Cited

OTHER PUBLICATIONS

PalDey, S., et al., "Cathodic arc deposited thin film coatings based on TiAl intermetallics". Intermetallics, 12 (2004) 985-991.*
International Search Report and Written Opinion issued in Application No. PCT/EP2021/076867 dated Jan. 18, 2022.

* cited by examiner

- E = 407 GPa
- H = 40.2 GPa
- Al 76at%

- E = 398 GPa
- H = 52.2 GPa
- Al 77at%

- E = 394 GPa
- H = 39.6 GPa
- Al 77at%

- E = 358 GPa
- H = 40.7 Gpa
- Al 79at%

- E = 400 GPa
- H = 41.4 GPa
- Al 79at%

METHOD FOR FORMING Al-RICH AlTiN COATING LAYERS BY PVD FROM METALLIC TARGETS

The present invention relates to an Al-rich AlTiN coating (hereafter also simply referred to as Al-rich AlTiN coating layer or Al-rich AlTiN layer or Al-rich AlTiN film) produced by a physical vapour deposition (PVD) process from metallic targets as well as a method for producing thereof.

The present invention relates furthermore to a coating system consisting of or comprising one or more of the above mentioned inventive Al-rich AlTiN layers.

An Al-rich AlTiN coating layer according to the present invention should be understood as a coating layer consisting of aluminium (Al), titanium (Ti) and nitrogen (N) or as a coating layer comprising aluminium (Al), titanium (Ti) and nitrogen (N) as main components.

In this context, the use of the term "Al, Ti and N as main components" in the Al-rich AlTiN layer means in particular that the sum of the content of Al, Ti and N in the Al-rich AlTiN layer as concentration in atomic percentage corresponds to more than 50 at % (i.e. a value between >50 at % and 100 at %), preferably more than 75 at % (i.e. a value between >75 at % and 100 at %), more preferably equal to or more than 80 at % (i.e. a value between 80 at % and 100 at %), if all chemical elements contained in the Al-rich AlTiN layer are considered for the determination of the whole chemical elements composition of the Al-rich AlTiN layer in atomic percentage.

The term "Al-rich" in this context is used in particular for indicating that the content of aluminium (Al) in the corresponding Al-rich AlTiN layer is equal to or preferably more than 70 at %, if only Al and Ti are considered for the determination of a chemical elements composition in atomic percentage (i.e. Al[at %]/Ti[at %]≥70/30).

STATE OF THE ART

AlTiN coating layers having Al content above 75 at.-% (in relation to Ti), exhibiting a cubic crystal structure and a columnar micro-structure are known to be synthesized by LP-CVD processes. These kinds of coatings are known to show superior wear protection compared to the coatings with lower Al-content, such as PVD based $Al_{0.67}Ti_{0.33}N$ coatings.

Historically, it is well known that PVD methods such as arc deposition, and reactive magnetron sputtering can be used for producing metastable cubic (B1 crystal structure) phased AlTiN layers with a maximum of 70 at.-% Al.

Furthermore, there are also some publications presenting possible methods for enhancing the metastable solubility limits of Al beyond 70 at. %. However, all these until now proposed methods involve some disadvantages.

OBJECTIVE OF THE PRESENT INVENTION

An objective of the present invention is to provide an Al-rich AlTiN coating and a method for producing thereof, which overcome or alleviate the disadvantages of the state of the art.

The Al-rich AlTiN coating should preferably exhibit cubic phase, high hardness, appropriate compressive stress and a coating microstructure, which preferably allows attaining high wear resistance and improved cutting performance, if the Al-rich AlTiN coating is applied on cutting tools.

A further objective of the present invention is to provide a flexible and reliable method for producing the inventive Al-rich AlTiN coatings.

DESCRIPTION OF THE PRESENT INVENTION

The objectives of the present invention are achieved by providing a method for producing Al-rich coating layers for coating substrates as described in the present description and also as claimed in the claims 1 to 5. Furthermore the objectives of the present invention are achieved by producing Al-rich AlTiN coating layers and substrates coated with such inventive coating layers as described in the present description and also as claimed in the claims 6 to 10. and The present invention relates concretely to a coating layer comprising solely Al, Ti and N, or comprising Al, Ti and N as main components, wherein the chemical elements composition in atomic percentage in the coating layer, when only these elements are considered, is given by the formula $(Al_aTi_b)_xN_y$, where a and b are respectively the concentration of aluminium and titanium in atomic ratio considering only Al and Ti for the calculation of the element composition in the layer, whereby a+b=1 and 0≠a≥0.7 and 0≠b≥0.2, and where x is the sum of the concentration of Al and the concentration of Ti, and y is the concentration of nitrogen in atomic ratio considering only Al, Ti and N for the calculation of the element composition in the layer, whereby x+y=1 and 0.45≤x≤0.55, wherein:

the coating layer exhibits:
  90% or more of fcc cubic phase, and
  compressive stress of 2.5 GPa or more, for example between 2.5 GPa and 6 Pa.

For some applications requiring rather a high compressive stress, the compressive stress can be preferably between 4 and 6 Pa. Furthermore, the present invention relates concretely to a method for producing a coating layer according to claim 1 on a surface of a substrate, wherein:

the coating layer is synthesized in the interior of a vacuum coating chamber by using reactive PVD cathodic arc evaporation techniques, wherein:
  nitrogen gas is introduced in the vacuum coating chamber to be used as reactive gas,
  at least one arc evaporation source comprising a target material operated as cathode for evaporating the target material is used,
  target material consists of Al and Ti or comprises Al and Ti as main components, wherein if only considering the content of Al and Ti in atomic percentage in the target material, then the ratio of Al[at %]/Ti[at %] in the target material is of 70/30 or more, i.e. Al[at %]/Ti[at %]≥70/30, preferably 70/30≤Al[at %]/Ti[at %]≤90/10,
  the method involve a reactive deposition of aluminium titanium nitride as a result of a reaction between aluminium and titanium from the target material with nitrogen introduced in the coating chamber as reactive gas,
  the reactive deposition of aluminium titanium nitride being carried out
    i. at a deposition temperature of less than 360° C., preferably as low as possible, e.g. between 150° C. and 250° C.,
    ii. at a nitrogen partial pressure of less than 3 Pa, preferably of less than 2 Pa, more preferably of less than 1.5 Pa, in any case higher than 0.05 Pa, preferably in a range between 0.1 Pa and 1.3 Pa, more preferably in a range between 0.1 Pa and 0.9 Pa, just sufficient enough to form stoichiometric nitride compounds,     iii. by using a bias voltage $U_b$ in a range corresponding to $-250\ V \leq U_b \leq -30V$, preferably in a range corresponding to $-200\ V \leq U_b \leq -40V$, more preferably in a range corresponding to $-200\ V \leq U_b \leq -60V$.

The inventors found that the use of a low pressure in the range suggested above, in combination with the other process parameters in the suggested ranges, in particular in combination with low process temperature (also called deposition temperature or substrate temperature during coating process) allows the formation of cubic phase fcc for high Al concentrations (Al[at. %]/Ti[at. %]≥70/30) but the arc discharge can turn unstable. Therefore the inventors suggests stabilizing the arc discharge by using an improved magnetic field at the arc source. With a such improved magnetic field it was possible to attain higher discharge voltages when low nitrogen partial pressures were used, which results in an stable process. Furthermore, in this manner, by using a low nitrogen partial pressure, the inventors attained to produce Al-rich aluminium titanium nitride coating layers according to the present invention, which exhibit a very low amount of droplets, which results in a very smooth surface of the inventive coating layers.

According to a preferred embodiment of a method according to the present invention as mentioned above, the arc evaporation source is operated by producing an arc discharge with discharge voltage of more than 30 V, in particular between 30V and 50V, what was possible in spite of the low nitrogen partial pressure. Typically the discharge voltage decreases when low nitrogen partial pressure is used.

A further advantage attained by using a discharge voltage>30 V was that surfaces of the target material (e.g. one or more AlTi-targets) that are nitrided or partially nitrided as a result of a reaction of target material with nitrogen present at the target surfaces during coating process, can be evaporated.

Furthermore the inventors suggests the dissipated electrical power (resulting in thermal load) should remind in the proximity of the target surface and should not dissipate into the substrate to be coated, in order to reduce thermal load in the substrate to be coated. In this manner the process temperature can be maintained low.

With this intention, preferably the method is carried out by using one or more arc evaporation sources of the type described by Krassnitzer in the document PCT/EP2020/068828 (having international publication number WO 2021/001536 A1), which is hereby incorporated by reference. In this manner it is possible to conduct the reactive PVD coating process and to produce the Al-rich AlTiN coating layer (with Al content higher than 75 at % as explained above) in a manner that an arc current of for example 200 A can be applied to the target and at the same time attaining a discharge voltage of more than 30 V (e.g. between 30 V and 50 V) in the arc discharge, but maintaining a contribution of less than 20% of the electrical power that would result in substrate heating (substrate heating in this context should be understood as thermal load in the substrate to be coated). The in many cases preferred source current of 200 A or substantially 200 A must not be understood in each case as a limitation of the present invention. The source current can vary depending on the arc source and the chemical element composition of the target being used. It can be, given as a useful example, in the range between 120 A and 200 A.

AlTiN with Al>75% coating layers (e.g. coating layers with chemical elements composition in a range between $(Al_{76}Ti_{33})N$ and $(Al_{90}Ti_{10})N$) are preferable produced according to the present invention growing in cubic structure (or at least to 90% in cubic structure) and having high hardness, by using during coating process a low temperature (i.e. a low process temperature during coating process), a low gas pressure for attaining a high energy input from ions (in this context a low gas pressure refers in particular to a low nitrogen partial pressure—preferably only nitrogen gas is introduced as process gas and reactive gas into the coating chamber during coating process and a high negative bias voltage.

The inventors have found that the combination of Al and Ti in the above mentioned ratio in the Al-rich AlTiN layer, it means Al [at %]/Ti [at %]≥70/30, preferably Al [at %]/Ti [at %]>70/30, more preferably 90/10≥Al [at %]/Ti [at %]≥80/20, has shown a big contribution for improvement of wear protection to tools and/or components.

Furthermore, the present invention relates to coatings systems including one or more inventive Al-rich AlTiN coating layers.

The inventive method mentioned above for producing the above the inventive Al-rich AlTiN coating layers can be also modified by using for example further targets and/or further reactive gas flows in order to produce other kind of coating layers to be combined with the inventive Al-rich AlTiN coating layers in order to produce different coating systems, e.g. as multilayer and/or gradient coating systems.

Furthermore, a reactive PVD coating process by using metallic target and by simultaneous introducing $N_2$ gas into the coating PVD chamber/apparatus is very important for the hard PVD coatings with complex coating architecture/design such as nanolayers and/or multilayers part of a coating or whole coating. PVD coating solutions for hard coatings on the tools and/or components. Preferably this coating solutions should have combination of the desired coating properties, such as microstructure, texture, elastic modulus, hardness and stress with thickness which is not limited to only 50 nm or less and with versatile (not very limited) coating properties, such as one single crystal grains orientation or very limited low residual compressive stress. Specifically, this coating solution should also be able to improve properties of AlTiN with Al content lower than 70%, since such material systems attracts lot of attention within the PVD hard coatings and consequently to improve wear resistance of for instance tools during the cutting process.

The Al-rich AlTiN coating layers and/or coating systems according to the present invention (i.e. comprising Al-rich AlTiN coating layers according the present invention) exhibit excellent mechanical properties, and is expected to have beneficial set of properties for providing superior performance to tools and components subjected to wear and stress collective.

The above mentioned inventive $(Al_aTi_b)_xN_y$ layers exhibit preferential the face-centered cubic structure. Importantly, the present invention describes the method to produce the inventive Al-rich AlTiN coating by a reactive physical vapour deposition (PVD) process by arcing metallic AlTi targets having more than 70 at. % and less than 100 at. % of Al (preferably between 75 at % and 90 at %) and by simultaneous introduction $N_2$ (nitrogen) gas into the coating PVD chamber/apparatus.

For providing a better understanding of the present invention, some Examples, Tables and Figures will be used below for describing the invention in more detail. However, these Examples, Tables and Figures should not be understood as a limitation of the present invention but only as concrete examples and/or preferred embodiments of the present invention.

The inventive examples of Al-rich AlTiN layers deposited according to the present invention, as described below, were conducted by using an cathodic arc evaporation process at a process temperature of 200° C. (in this context the term "process temperature" is used for referring in particular to the set temperature during the coating deposition process) and at a low nitrogen partial pressure of less than 1.5 Pa. AlTi targets with element composition in at % of 80Al/20Ti were used as Al and Ti material sources and the targets were operated as cathode by applying an arc current of 200 A and for each example a different substrate bias voltage and pressure.

The 5 examples of such deposition process with detailed process parameters are given in Table 1.

Figure 1A:
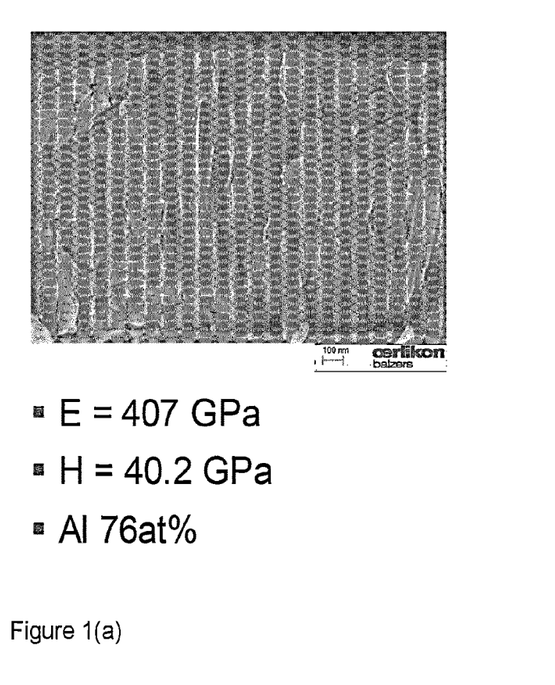
Figure 1B:
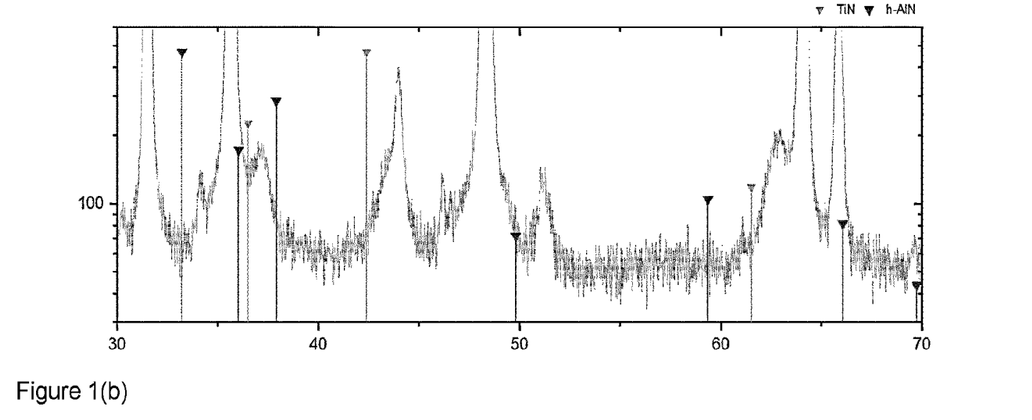
Figure 2A:
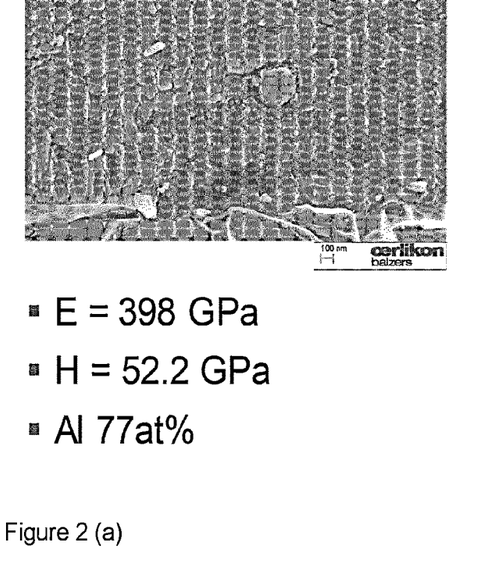
Figure 2B:
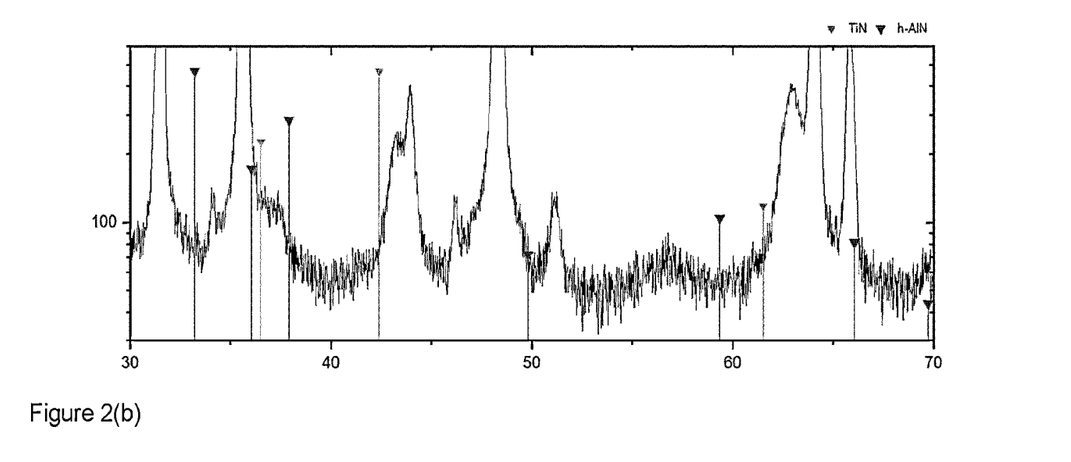
Figure 3A:
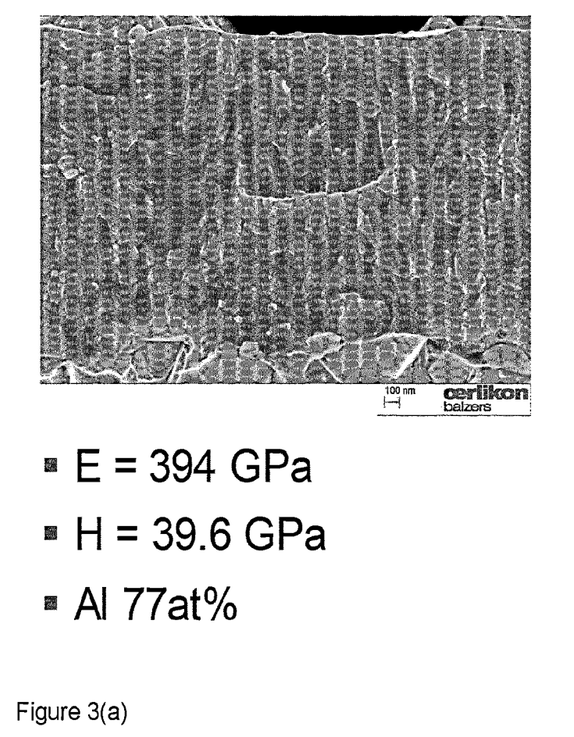
Figure 3B:
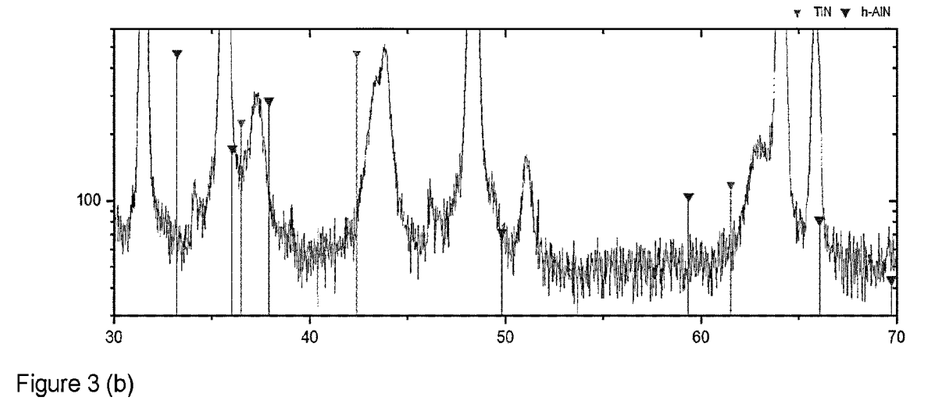
Figure 4A:
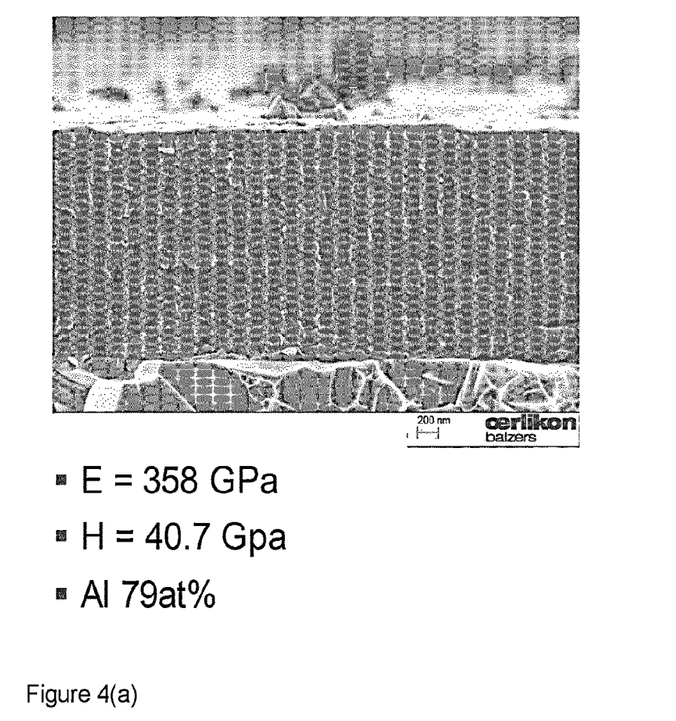
Figure 4B:
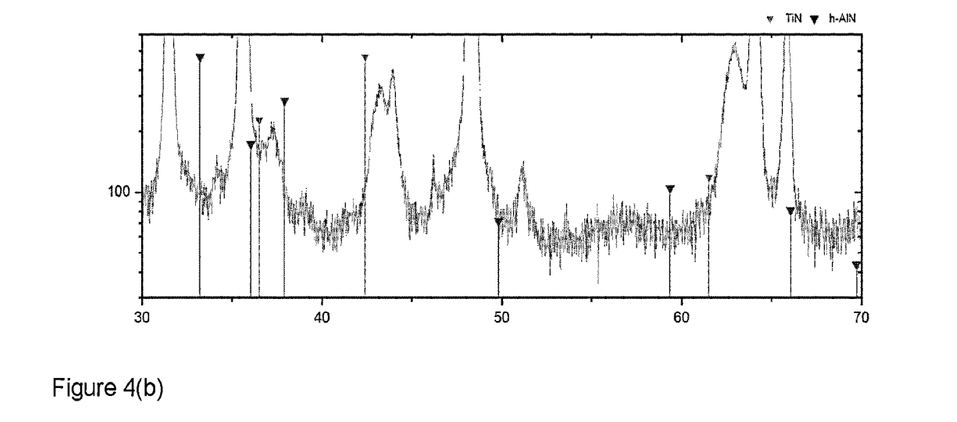
Figure 5A:
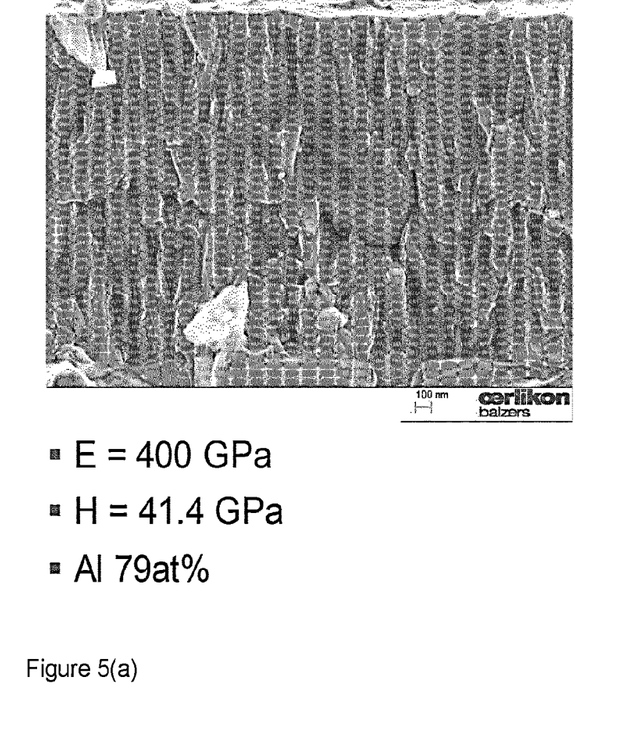
Figure 5B:
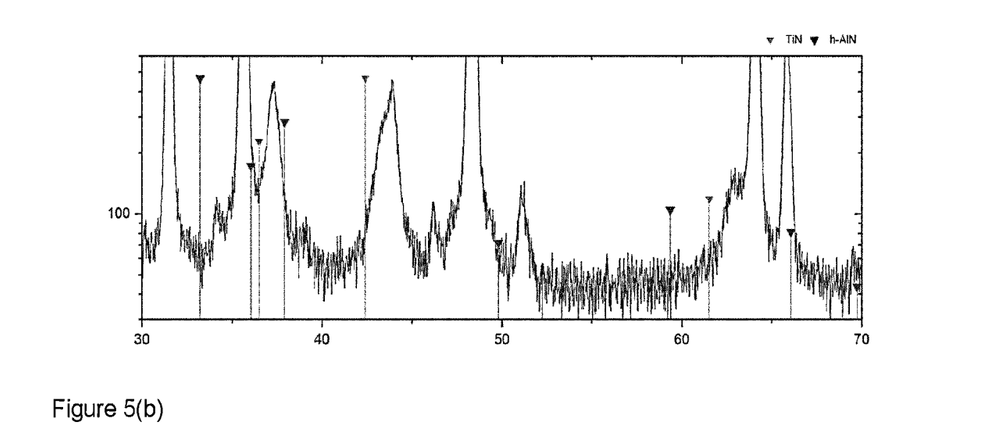

The properties of the Al-rich AlTiN coatings obtained by processes given in the Examples 1 to 5 are given in FIGS. 1 to 5.

FIGURES

FIG. 1: (a) SEM fracture cross-section image of the Al-rich AlTiN coating film deposited according to the inventive Example 1, and (b) patters of as-deposited films.

FIG. 2: (a) SEM fracture cross-section image of the Al-rich AlTiN coating film deposited according to the inventive Example 2, and (b) patters of as-deposited films.

FIG. 3: (a) SEM fracture cross-section image of the Al-rich AlTiN coating film deposited according to the inventive Example 3, and (b) patters of as-deposited films.

FIG. 4: (a) SEM fracture cross-section image of the Al-rich AlTiN coating film deposited according to the inventive Example 4, and (b) patters of as-deposited films.

FIG. 5: (a) SEM fracture cross-section image of the Al-rich AlTiN coating film deposited according to the inventive Example 5, and (b) patters of as-deposited films.

FIGS. 1(a), 2(a), 3(a), 4(a) and 5(a): SEM fracture cross-section images of monolithic coatings of Al-rich AlTiN deposited in the 5 examples of process with the parameters given in the Table 1, including also Young's modulus (E), hardness (H), and Al content measured in the deposited films.

FIGS. 1(b), 2(b), 3(b), 4(b) and 5(b): XRD patterns of the as-deposited films from the 5 examples of Al-rich AlTiN coatings deposited by the process with the parameters given in the Table 1.

TABLE 1 coating parameters used for coating deposition for the Examples 1 to 5

| Example | Target | Temperature | Source current | $N_2$ pressure | Bias voltage |
|---------|--------|-------------|----------------|----------------|--------------|
| 1 | AlTi 80/20 | 200° C. | 200 A | 0.3 Pa | −150 V |
| 2 | AlTi 80/20 | 200° C. | 200 A | 0.5 Pa | −120 V |
| 3 | AlTi 80/20 | 200° C. | 200 A | 0.3 Pa | −100 V |
| 4 | AlTi 80/20 | 200° C. | 200 A | 0.5 Pa | −100 V |
| 5 | AlTi 80/20 | 200° C. | 200 A | 0.3 Pa | −120 V |

The film structural analyses were conducted by X-ray diffraction (XRD) using a PANalytical X'Pert Pro MPD diffractometer equipped with a CuKa radiation source. The diffraction patterns were collected in Bragg-Brentano geometry. Micrographs of the film fracture cross-sections were obtained with a FEGSEM Quanta F 200 Scanning Electron Microscope (SEM).

The hardness and indentation modulus of the as-deposited samples were determined using an Ultra-Micro-Indentation System equipped with a Berkovich diamond tip. The testing procedure included normal load of 10 mN. The hardness values were evaluated according to the Oliver and Pharr method. Thereby, we assured an indentation depth of less than 10% of the coating thickness to minimize substrate interference.

FIGS. 1(a), 2(a), 3(a), 4(a) and 5(a) show SEM micrographs of the fractured cross section of the films from the examples 1 to 5 and the coating properties: elastic modulus (Young's modulus), hardness and the Al content.

FIGS. 1(b), 2(b), 3(b), 4(b) and 5(b) show: XRD patterns of the as-deposited films from the examples 1 to 5 and those XRD-patterns suggest a face-centered cubic crystal structure for all coatings. This Figures show in particular the variation in microstructure and in presence of minor wurtzite phase when the inventive coating layers are processed with different process parameters as indicated in Table 1.

To produce inventive Al-rich AlTiN-based film, the inventors used a reactive arc deposition process on metallic targets with minimum of 70 at % of Al, in which the inventive combination of the deposition parameters were selected based on the following understanding:
  a) at target: Arc discharge current, distribution and strength of the magnetic field are chosen to form the desired plasma state of film forming species, consisting of single and multiple charges ions of Al, Ti, and N
  b) at substrate: Bias voltage is high enough to increase the kinetic energy, thereby increasing the quench rate of incident ions at the thin film growth front. Simultaneously, substrate temperature is low enough to freeze the ad-atom mobility on the growth front.
  c) general: Nitrogen gas pressure is manipulated within the desired window, that is low enough to reduce the population of nitrogen ions, thereby suppressing the nucleation of hexagonal phase enabled by gas ion induced remixing effects on the growth surface, and the nitrogen gas pressure is sufficiently high enough to form stoichiometric AlTiN thin film.

By optimizing the abovementioned process levers of the arc deposition, nucleation of thermodynamically favoured hexagonal phase is suppressed at the growth surface, and thereby the metastable solubility of Al in the c-AlTiN has been raised to higher concentration with more than 75 at. % (e.g. 80 at. %).

Miscellananeous

Generally said it is intended to claim optionally—when the time may have been come—independent or additional to initially existing claims protection for a layer and or a method according to one or more (combined) paragraphs that follow hereinafter:

A coating layer comprising Al, Ti and N as main components and having chemical elements composition in atomic percentage regarding these elements according to formula $(Al_aTi_b)_xN_y$, where a and b are respectively the concentration of aluminium and titanium in atomic ratio considering only Al and Ti for the calculation of the element composition in the layer, whereby a+b=1 and 0≠a≥0.7 and 0≠b≥0.2, and where x is the sum of the concentration of Al and the concentration of Ti, and y is the concentration of nitrogen in atomic ratio considering only Al, Ti and N for the calculation of the element composition in the layer, whereby x+y=1 and 0.45≤x≤0.55, which is inventive in that: the coating layer exhibits: 90% or more of fcc cubic phase, and compressive stress of 2.5 GPa or more, preferably between 2.5 GPa and 6 GPa.

A method for producing a coating layer according to the aforementioned paragraph on a surface of a substrate, being inventive in that the coating layer is synthesized in the interior of a vacuum coating chamber by using reactive PVD cathodic arc evaporation techniques, wherein: nitrogen gas is introduced in the vacuum coating chamber to be used as reactive gas, at least one arc evaporation source comprising a target material operated as cathode for evaporating the target material is used, target material consists of Al and Ti or comprises Al and Ti as main components, wherein if only considering the content of Al and Ti in atomic percentage in the target material, then the ratio of Al[at %]/Ti[at %] in the target material is of 70/30 or more, the method involve a reactive deposition of aluminium titanium nitride as a result of a reaction between aluminium and titan from the target material with nitrogen comprised in the coating chamber, the reactive deposition of aluminium titanium nitride being carried out at a deposition temperature of less than 360° C., at a nitrogen partial pressure of less than 3 Pa, preferably of less than 2 Pa, more preferably of less than 1.5 Pa, by using a bias voltage Ub in a range corresponding to $-250\ V \leq Ub \leq -30V$, preferably a range corresponding to $-200\ V \leq Ub \leq -40V$, more preferably a range corresponding to $-200\ V \leq Ub \leq -60V$.

A Method according to the directly preceding paragraph, being particular in that the arc evaporation source is operated by producing an arc discharge with discharge voltage of more than 30V.

A Method according to the directly preceding paragraph, being particular in that the arc discharge is produced in a manner that it has a contribution of less than 20% of the electrical power that results in the substrate heating.

What is claimed is:

1. A method for producing coated substrates involving deposition of at least one coating layer on a surface of a substrate, the method comprising the steps of:
   synthesizing the at least one coating layer in an interior of a vacuum coating chamber by using reactive PVD cathodic arc evaporation techniques, wherein the synthesizing includes:
      introducing nitrogen gas into the vacuum coating chamber to be used as reactive gas,
      using at least one arc evaporation source comprising a target material operated as cathode for evaporating the target material, wherein
      the target material comprises Al and Ti as main components, and when considering only the content of Al and Ti in atomic percentage in the target material, then a ratio of Al/Ti is 70/30 or more,
   and depositing aluminium titanium nitride as the coating layer, wherein:
   the reactive deposition of aluminium titanium nitride being carried out:
      i. at a deposition temperature of less than 360° C.,
      ii. at a nitrogen partial pressure of less than 3 Pa by using a bias voltage Ub at the substrate in a range corresponding to $-250\ V \leq Ub \leq -30V$,
      iii. the at least one coating layer:
         a. comprises Al, Ti and N as main components and having a chemical element composition in atomic percentage regarding these elements according to formula $(Al_a Ti_b)_x N_y$, where a and b are respectively the concentration of aluminium and titanium in atomic ratio when considering only Al and Ti for the calculation of the element composition in the layer, whereby $a+b=1$, $a \geq 0.7$ and $b \geq 0.2$; and where x is the sum of the concentration of Al and the concentration of Ti, and y is the concentration of nitrogen in atomic ratio when considering only Al, Ti and N for the calculation of the element composition in the coating layer, whereby $x+y=1$, $0.45 \leq x \leq 0.55$ and $0.90 \leq y \leq 1.10$,
         b. exhibits 90% or more of fcc cubic phase, and
         c. exhibits a compressive stress of 2.5 GPa or more.

2. The method according to claim 1, wherein the deposition temperature is in a range between 150° C. and 250° C. and the nitrogen partial pressure is in a range between 0.1 Pa and 1.3 Pa.

3. The method according to claim 1, wherein the arc evaporation source is operated by producing an arc discharge with discharge voltage of more than 30 V.

4. The method according to claim 1, wherein the arc discharge is produced in a manner that it has a contribution of less than 20% of the electrical power that results in heating of the substrate.

5. The method according to claim 1, wherein process parameters in following ranges are used:
   the target material exhibiting ratio of Al/Ti in a range of $90/10 \geq Al/Ti \geq 80/20$,
   deposition temperature in a range between 180° C. and 220° C.,
   nitrogen partial pressure in a range between 0.1 Pa and 0.9 Pa.
   bias voltage in a range between −200 V and −60 V.

6. The method according to claim 1, wherein the nitrogen partial pressure is less than 2 Pa.

7. The method according to claim 6, wherein the nitrogen partial pressure is less than 1.5 Pa.

8. The method according to claim 1, wherein the bias voltage Ub at the substrate is in a range corresponding to $-200\ V \leq Ub \leq -40V$.

9. The method according to claim 8, wherein the bias voltage Ub at the substrate is in a range corresponding to $-200\ V \leq Ub \leq -60V$.

10. The method according to claim 1, wherein the compressive stress is between 2.5 GPa and 6 GPa.

11. The method according to claim 2, wherein the nitrogen partial pressure is in a range between 0.1 Pa and 1 Pa.

12. The method according to claim 11, wherein the nitrogen partial pressure is in a range between 0.1 Pa and 0.9 Pa.

13. The method according to claim 3, wherein the discharge voltage is less than 50 V.

* * * * *